United States Patent [19]

Sullivan

[11] Patent Number: 4,775,611
[45] Date of Patent: * Oct. 4, 1988

[54] ADDITIVE PRINTED CIRCUIT BOARDS WITH FLAT SURFACE AND INDENTED PRIMARY WIRING CONDUCTORS

[76] Inventor: Donald F. Sullivan, 115 Cambridge Rd., King of Prussia, Pa. 19406

[*] Notice: The portion of the term of this patent subsequent to Jul. 12, 2005 has been disclaimed.

[21] Appl. No.: 681,839

[22] Filed: Dec. 14, 1984

Related U.S. Application Data

[63] Continuation-in-part of Ser. No. 550,379, Nov. 10, 1983, Pat. No. 4,528,259.

[51] Int. Cl.$^4$ .............................................. G03C 5/00
[52] U.S. Cl. .................................. 430/314; 430/315; 430/319; 427/98; 174/68.5
[58] Field of Search .............. 430/315, 319, 311, 313, 430/314; 427/98, 96; 174/68.5

[56] References Cited

U.S. PATENT DOCUMENTS

| | | | |
|---|---|---|---|
| 3,649,274 | 3/1972 | Older et al. ...................... | 430/315 X |
| 4,003,877 | 1/1977 | Lipson et al. ......................... | 427/98 |
| 4,054,483 | 10/1977 | Peiffer .................................. | 156/632 |
| 4,324,815 | 4/1982 | Mitani et al. ........................ | 427/96 |
| 4,442,198 | 4/1984 | Tsao et al. ............................ | 430/311 |
| 4,469,777 | 9/1984 | O'Neil ................................... | 430/315 |
| 4,526,810 | 7/1985 | Nesbitt .................................. | 427/98 |
| 4,572,764 | 2/1986 | Fan ...................................... | 156/630 |

FOREIGN PATENT DOCUMENTS 2126428 3/1984 United Kingdom .

Primary Examiner—José G. Dees
Attorney, Agent, or Firm—Laurence R. Brown

[57] ABSTRACT

High density primary wiring patterns are formed on printed wiring boards with far less than 0.005 inch spacings and wiring conductor widths, which surprisingly permit wider conductors of at least three times the wiring spacing thus less likely to have open circuit or substrate adherance defects. This is achieved by depositing on an irregular surface of a conventional "flat" panel insulator a thick liquid photopolymer layer of paste-like consistency, such as 0.006 inch thickness, flattening it with the image bearing side of a glass plate phototransparency to produce high resolution wiring patterns comprising ridge tops defining insulating spacing between channel conductor areas therebetween by means of uncollimated actinic radiation, forming thin conductive layers 0.0014 inch thick on the channel bottoms and sidewalls to produce wider conductors, and sanding off the flat ridge tops to assure that there are no short circuits between adjacent conductors.

14 Claims, 1 Drawing Sheet

U.S. Patent    Oct. 4, 1988    4,775,611
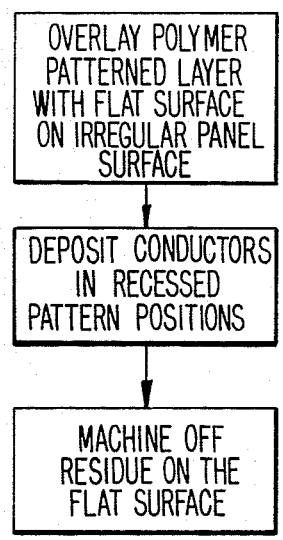
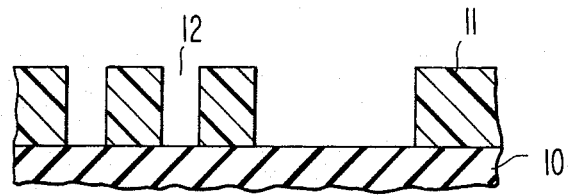
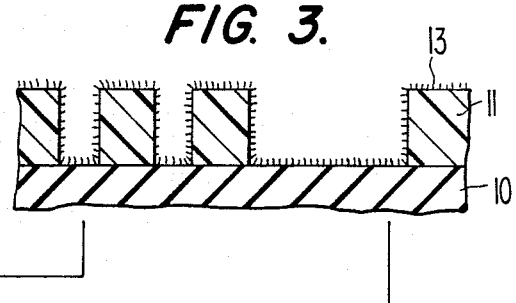
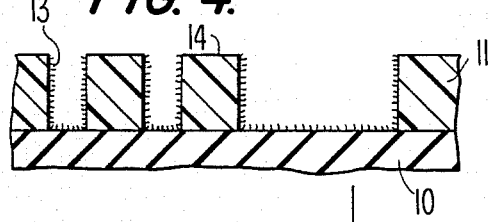
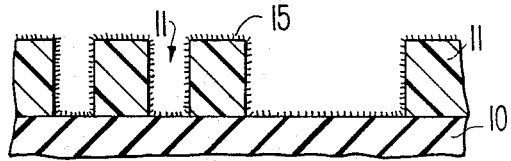
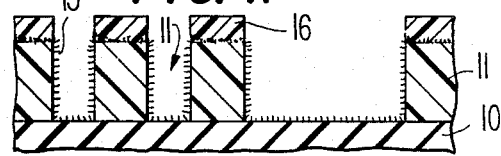
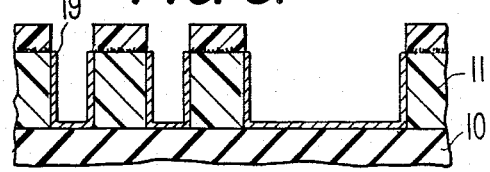
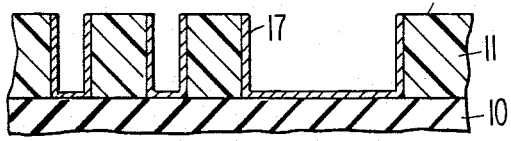

ADDITIVE PRINTED CIRCUIT BOARDS WITH FLAT SURFACE AND INDENTED PRIMARY WIRING CONDUCTORS

This is a continuation-in-part of my copending application Ser. No. 550,379 filed Nov. 10, 1983, U.S. Pat. No. 4,528,259 for Printed Wiring Boards With Solder Mask Over Base Copper Wires Having Large Area Thickened Circuit Pad Connections.

TECHNICAL FIELD

This invention relates to printed wiring boards and more particularly it relates to additive methods of producing primary printed wiring patterns on insulating panels by patterning the surface of the panels with an insulation layer defining the wiring patterns.

BACKGROUND ART

Present methods of producing primary conductor lines on PWB substrates introduce problems, such as the following:

(1) Where copper etching is required, waste disposal becomes a problem;

(2) Where palladium or like high cost catalysts are used, high expense and waste is encountered;

(3) Resolutions are so limited that high density wiring is not feasible;

(4) Space limitations require more conductor density than has heretofore been feasible;

(5) Because of dirt, scratches and undercutting, etching techniques result in lack of adhesion of fine conductor lines to the substrate insulation, reduce line widths that may result in open circuits and cause conductive traces between lines that may result in short circuits;

(6) Resist layers are typically so thin that they do not well serve as dams for limiting spillover or mushrooming of plating conductors;

(7) The necessary thicknesses of conductors are hard to achieve when the conductor line widths become narrow and all the above problems are accentuated; and (8) The selective cleaning of conductor traces from insulating spaces between lines becomes almost impossible, particularly for high density wiring boards Attempts to sand off resist layer surfaces could not succeed because the standard substrates used are not flat surfaced but have irregular surfaces with indentations of greater than 1 mil (0.001 inch) so that sanding of the surface would not be complete in some places and would damage conductor wiring lines in other places. Also, on high density boards, any contact with very thin width lines can result in catastrophic failure.

High density printed wiring boards (PWB) are considered to be those having conductor lines and spaces of 5 mils (0.005 inches); that is conductors 5 mils wide separated by 5 mils of insulation spaces. It is very difficult to achieve a high yield when manufacturing such high density boards, owing primarily to the difficulty in achieving photoresist patterns having the required resolution and being well bonded to the base laminate. Another factor limiting the production of very fine conductor lines is the copper foil etching step. Even with copper foil, 0.35 mils thick (¼ ounce per square foot), there is the problem with undercutting 5 mil lines and ruining the PWB.

The photoresist imaging step further requires that the copper surface be free of minute scratches which could cause the photoresist to bridge over top and thereby be undercut by the etchant. Additionally, any speck of dust can cause imperfections in the photoresist patterns extending well beyond the size of the particle.

The use of additive circuitry has been used in the prior art to circumvent the problems associated with etching fine lines from copper foil. Additive circuits are formed on an insulation substrate generally flat panel, wherein the unclad substrate is electroless plated overall with a thin conductive layer, then photopatterned with a plating resist pattern covering part of the plating to define the primary circuit wiring pattern. The exposed plating is then electroplated to increase the thickness of conductors. The conductors are then permanently defined by removing the plating resist and etching the thin layer of electroless copper now resident between the conductors. This type is known as semi-additive, in that electroplating is used.

Fully additive circuits are made in the prior art by using a seeded flat panel base laminate, which catalyses the insulation making it receptive to electroless copper deposition, thereby permitting conductors to be formed by imaging a permanent plating resist onto the base laminate. When electroless plated the conductors are formed on the base laminate only where not covered by plating resist.

With subtractive circuits, one limiting factor on reliable fine line production is the photoresist imaging step. The industry standard for high density boards is a conductor thickness of 0.0014 inches. Thus, the photoresist pattern needs to be at least 0.0014 inches thick so as to confine plated copper and prevent mushrooming onto adjacent spaces.

With available dry film photoresists having standard thickness, the resolution is practically limited to four times the photoresist thickness, indicating that 0.0056 inch conductors are the finest which can be achieved in a production environment without sacrificing yield. The dry film photoresist resolution is limited by the undercutting experienced during developing. Before unexposed photoresist can be washed out, it must first be softened by the developer solution, and during this lengthy washout cycle, the hardened photoresist is being undercut. Typically the undercutting is equal to the photoresist thickness, so that a photoresist line 0.0056 inches wide has only 0.0028 inches bonded to the substrate.

One further limitation on the production of fine lines is the fragility of the copper traces and their susceptibility to damage from handling during the manufacturing process.

In all printed wiring board manufacturing processes known to the applicant, high density wiring is achieved by making the conductors narrower in width, while maintaining the conductor thickness at the standard 0.0014 inches. Further, the circuitry is bonded to the top of the base laminate and is vulnerable to damage from scratches and abrasion prior to the solder masking step. In all known processes, the conductor width exceeds the conductor thickness by a factor of at least 2 to 1, and typically 3 to 1.

One objective of this invention is to solve these prior art problems.

Other objects, features and advantages of the invention will be found throughout the following description, claims and drawing.

DISCLOSURE OF THE INVENTION

Primary wiring conductor patterns on printed wiring boards are formed by imaging a layer of photopolymer on a conventional panel substrate to define the wiring pattern in the indented channel portions and define a flawless flat top surface. Then circuit conductors are formed by electroless depositions on the contoured surface. Any residue conductor on the flat top surface then may be sanded off without damage to the circuit conductors. Higher resolution and greater packing density is obtainable, surprisingly with wider thin layer conductors having more adherance and conductivity than feasible with prior art high density circuits.

An unclad insulation flat panel substrate having an irregular surface is coated with a 3 mil layer of liquid photopolymer which adheres to the irregularities. Then a glass plate phototransparency with image side in contact with the polymer is coated with a 3 mil coating and the two photopolymer layers cojoined in a vacuum chamber to achieve an air bubble free union with a flat outer surface provided by the glass plate. Note that the liquid polymer is of paste-like consistency to fill the irregularities and from the flat outer surface adjacent the glass plate without irregularities. When exposed to a source of actinic light, patterns of hardened photopolymer are formed having a resolution well beyond that achievable with current art dry film systems. A thickness to width ratio of two to one can be achieved without the use of expensive equipment, a ratio which is better than dry film ratios by a factor of 6.

After the photopatterns are formed and developed to remove unhardened resist, the deep channels including the sidewalls are metallized by electroless deposition and electrical conductors are thereafter brought up to standard 0.0014 inch thickness by known electroless processes, or a combination of electroless and electroplating.

A fully additive board is made in one embodiment in a novel way which is less expensive than known current art methods while providing much greater conductor density. This is accomplished by photopatterning the liquid photopolymer as just described to produce the deep narrow channels. The board is started through the electroless deposition process using known processes and chemicals, including the conditioning of the surface and the immersion of the PWB into the palladium chloride solution whose purpose is to establish precious metal sites onto which electroless metal will be plated out in a subsequent step. The precious metal sites are thereby formed on all surfaces contacted by the liquid; the channel sidewalls, photopolymer outer flush surface and through hole walls. At this point in the manufacturing cycle the PWB is wet sanded and washed to remove the precious metal sites from the flush outer surface without disturbing those sites in the deep channels and through holes. This could not be done without the flat outer surface provided by the glass plate and thicker (0.006 inch) channels, since there are so many surface irregularities of up to 0.002 in. in substrate "flat" panels that surface sanding would damage conductors or leave surfaces unsanded at the irregularity sites. When the electroless plating process is completed using known processes, only the channels and through holes are metallized.

A semi-additive PWB is made in another embodiment by forming the deep channels as previously described and a thin sheath of electroless copper is built up over all surfaces using known processes and chemicals. A plating resist layer is roller coated onto the flattened flush outer surface, leaving the deep channels and through holes free of plating resist. The copper is then electro-plated to full thickness and the conductors are then completely defined by sanding the outer flat surface to remove the plating resist and underlying electroless copper layer. The semi-additive process is thus accomplished with only one photopatterning step and the usual steps of chemical stripping of plating resist and electroless copper are not required, thereby achieving production economies while producing PWB having greatly increased conductor density.

The elimination of the prior art chemical etching of unwanted copper is highly desirable as a means of pollution reduction, for the etching step typically results in metallic copper being discharged into the environment with the rinse water. In contrast, the mechanical removal of unwanted copper results in the production of a dry non-polluting powder.

The invention is thus a process which achieves high resolution patterns such as conductor recessed channels 0.003 inch wide having near vertical sidewalls in a very thick section of the order of 0.006 inch. The process can be described as overlaying on an insulation panel with an irregular flat surface a polymer layer with a flat outer surface without irregularities to produce recesses or channels to position and house electrical conductors; depositing metallic circuit material in the deep channels; and removal of unwanted metallic material from the flat outer surfaces by mechanical means such as sanding.

The disclosed process can reduce by $\frac{2}{3}$ the additive electroless plating time to achieve a given electrical conductivity. Since the channel conductor width is 0.015 inches (0.006 sidewalls and 0.003 base laminate) then the conductor thickness can be reduced to $\frac{1}{3}$ the prior art thickness of 0.0014 inches. This feature can reduce the immersion time from 24 hours to 8 hours to achieve the same conductivity as a prior art conductor 0.005 inches wide.

DESCRIPTION OF THE DRAWINGS

FIG. 1 is a flow diagram showing the steps to be followed in manufacturing printed wiring boards by the process described herein; and FIGS. 2 through 8 show fragmented sections of a printed wiring board at the various stages of manufacture, for both the fully additive and semi-additive embodiments described herein.

THE PREFERRED EMBODIMENTS

Reference is made to FIG. 1 which shows the sequence of processing steps to be followed to produce fully additive and semi-additive printed wiring boards, and to FIG. 2 which shows the PWB surface configurations at the various steps of the manufacturing cycles.

In FIG. 2 a fragmented section of a printed wiring board unclad laminate 10 is shown with photopatterned ridges all formed thereon having interspersed channels 12.

The photopatterning process disclosed in parent application S.N. 550,379 and used in this disclosed process to produce flat top ridges and a flat outer surface without the irregularities of the standard insulation laminate panels 10 includes the steps (1) preparing a glass plate phototransparency carrying the printed wiring conductor patterns as opaque images, and (2) then coating the image surface of the phototransparency with a layer of liquid photopolymer of paste-like consistency to a thickness of 0.003 inches, preferably by screen printing using a 60 mesh screen without a stencil. A layer of liquid photopolymer of 0.003 inches thickness is also applied to the printed wiring base laminate 10, and the two photo-polymer layers are joined in air free contact, preferably in a vacuum chamber to form a total thickness of 0.006 inch with a flat top surface assured by the glass plate, thereby to eradicate any surface irregularities on the laminate 10. After joining the photopolymer layers the assembly is irradiated with UV light energy through the image pattern to harden the light struck areas and thus form ridges 11. The resulting wiring pattern is completed by washing out unhardened photopolymer in a solvent such as butyl cellosolve to form wiring channels 12. The resulting patterns are characterized as having deep (0.006 inch) channels 12 into which a plating layer of metal preferably 0.0014 inch thick will be deposited to form the conductors 17, and a flat flush outer surface which compensates for irregularities in the substrate surface.

The flush outer surface is thus totally planar and is as flat as the glass plate phototransparency. Typically, printed wiring insulation substrates have non-uniform surface topology. Such variations in thickness are compensated for in this instant disclosure by forming the liquid photopolymer outer surface to a flat surface having much less deviation than the insulation substrate. This added flatness of the photopolymer patterns is important, for unwanted material now may be sanded from the outer surface with far less chance of removing conductive material from the sidewalls of the ridges or of missing the removal of conductive material from some ridges.

The aforedescribed photopatterning process which is described in my U.S. patent application Ser. No. 550,379, is capable of producing deep channels which are 0.006 inhes deep and 0.002 inches wide, and this is a novel process which represents a significant improvement over the prior art wherein such a thick photoresist layer cannot be patterned to such high resolution. As previously described, the currently available dry film negative acting plating resists can be photopatterned reliably with a thickness to line width ratio of 1 to 3, with an upper limit of 0.002 inches thick. Positive-acting photoresists can achieve a 1 to 1 thickness to line width ratio, with an upper limit on the thickness of the order of 0.0005 inches. The disclosed process achieves a thickness to width ratio of 2 to 1, which is 6 times better than current dry film photoresists. Further, this is with a 0.006 inch thickness.

The disclosed process is able to produce such a large increase in resolution by virtue of three factors when compared to current art dry film photoresists. First, the dry film photopolymer has a separator film between the photopolymer and the phototool which permits light to undercut opaque areas on the phototool, and thereby reduce the fidelity of resulting photopatterns. In the disclosed process the phototool emulsion need not be separated from the photopolymer, and this significantly improves resolution.

The importance of having the phototool emulsion in direct contact with the wet liquid photopolymer cannot be overemphasized, for this emulsion to emulsion contact is largely responsible for the production of thick photo-patterns having nearly vertical sidewalls, and this occurs without the need for collimated radiation.

A second desirable effect of emulsion to emulsion contact between phototool and wet resist is the elimination of one reflective surface; the surface at the interface of the lower surface of the phototool and its junction with the separator film on dry film photoresists. By eliminating one reflecting surface the exposure time is reduced, since more light energy reaches the liquid photopolymer. Also, noise is eliminated by reflective bouncing of radiant energy.

The second factor providing increased resolution is that in the disclosed process the liquid photopolymer which is unexposed is washed out in a solvent in 10 to 15 seconds as compared to 1 minute for the dry film, for the dry film requires much more time to become liquified. While becoming liquified, the dry film photoresist lines are being undercut by the developer solvent, and this under-cutting normally equals the dry film thickness on each line edge. In contrast, there is no undercutting of the photoresist lines formed from a liquid photopolymer.

The third factor which contributes to the improved resolution of the disclosed process is the increased photospeed of the liquid photopolymer and its tolerance of high intensity light energy for shorter periods of time. Thus, lower heat, lower energy and less tolerance variations from thermal expansion, etc. are encountered.

Thus, due to the aforementioned limitations of prior art photoresists, it has not been feasible heretofore to generate photopatterns which are so deep and narrow.

The narrow channels, about 0.002 inches to 0.003 inches wide, provide greater conductor density than heretofore possible. The depth of the channels, 0.006 inches, provides a means for sanding the outer surfaces while leaving intact the metallization in the channels on the polymer layer sidewalls and on the base laminate 10. Further, the depth of the channels with the sidewall coating permits the conductor cross section areas of a 0.003 inch wide conductor to be at least 3 times that of a 0.003 inch wide conductor formed by a dry film photoresist 0.002 inches thick on the base laminate only. Additionally, the plated conductors are anchored to the insulation over a much larger surface contact area than prior art conductors formed on top of insulation substrates by a factor of the order of 6 to 1.

Thus, it can be seen that prior art photoresists and processes could not produce the thick narrow conductor channels as required to increase the printed wiring density with the increased conductor cross section area and with the increased production yield as disclosed herein. It would have heretofore been deemed non-feasible to produce greater conductor widths while increasing the packing density.

Reference is made to the book Printed Circuits Handbook, edited by Clyde Coombs, Jr., published by McGraw-Hill, 1978. This book contains a good description of conventional printed wiring board manufacturing processes and chemicals relating to metallizing insulation substrates and manufacturing both subtractive and additive printed wiring boards.

Conductor formation is accomplished by using known and readily available electroless copper deposition chemicals as described in the referenced handbook. The known processes for depositing electroless copper on an insulating surface includes the immersion of a substrate into a catalyzing solution which establishes precious metal sites 13 on the surface of the non-conductor to which electroless copper atoms will be deposited in a subsequent step. At this step, shown in FIG. 3, the catalyzed sites 13 are non-conductive. At this point in the manufacturing cycle, the conductors can be entirely formed by electroless deposition (additive) or be a combination of electroless deposition followed by electro-plating to build up the copper to full thickness (semiadditive).

Fully additive boards are made in this instant disclosure by removing the catalyzed sites 13 from top surfaces 14 by a machinery step such as wet sanding as shown in FIG. 4. This is a novel and unique step made feasible by the thick photopolymer layer which permits the outer surfaces to be sanded without significant reduction of the precious metal sites 13 along the sidewalls and along base laminate 10 and without leaving the catalyst on top 14 of some of the ridges 11. After sanding, the board is subjected to the known electroless deposition step, which builds up metallic copper conductors 17 at the electroless catalyst areas on the laminate 10 and side-walls of the polymer layer, while leaving sanded top ridge flat surfaces 18 free of any metallic copper deposits.

The precious metal sites are typically palladium, deposited from a palladium chloride solution. The cost of the palladium is extremely high, and is an important factor in the total cost of a printed wiring board. In this instant disclosure wherein the precious metal sites are removed by wet sanding, the removed palladium is contained in the rinse water and can be readily reclaimed. This is a novel feature, for in all prior art processes known to the applicant the precious metal which forms the sites for electroless deposition is non-recoverable economically.

In the second semi-additive embodiment, where the conductors are to be electroplated, the process shown in FIGS. 6, 7 and 8 is followed. In FIG. 6 the precious metal sites 13 have been left on the flat top ridge surfaces and a thin layer of electroless copper 15 has been deposited on all catalyzed surfaces. To limit electroplated copper to only the wire defining channels 11, a plating resist 16 is applied to the outer flat ridge top surfaces, preferably applied by roller coating. Roller coating is also feasible by this invention only because of the flush planar photopattern surfaces since irregular surfaces would cause some ridge tops to be missed. The electroplating is performed using known and available chemicals and equipment, to produce the 0.0014 inch thick conductive layer 19.

Following electroplating, the conductor patterns are completed by simultaneously removing plating resist 16 and underlying thin copper layer 15 by sanding. The sanding step provides a further improvement over prior art semi-additive processes, in that the disclosed process does not require a chemical etching step to remove unwanted copper, nor does the plating resist layer have to be stripped chemically. By obviating the need for chemical etching to remove the electroless copper a significant improvement in the prior art is made, since in the prior art the etching step also removes an equivalent thickness of wanted copper from traces and through hole walls, thereby undesirably diminishing its thickness. Also, any copper pollution in waste rinse water, etc. is eliminated as well as chemical fumes.

Thus, the present invention provides a novel method of additive primary circuit wiring pattern formation on printed wiring boards, wherein (1) the irregular surface of starting insulation substrate panels are covered with a thick layer (0.006 inch) of liquid paste-like consistency photopolymer coating imaged through a glass plate phototransparency with image surface in contact with the liquid polymer to produce a flat top surface without the irregularities, (2) the wiring pattern is produced by channels photo-optically formed in the photopolymer coating, (3) these channels including substrate panel surface and photopolymer sidewalls are coated with metallic copper conductor 0.0014 inch thick and (4) the flat top surface is sanded off to remove any conductive materials.

Having improved the state of the art, those novel features believed descriptive of the spirit and nature of the invention are defined with particularity in the following claims.

What I claim:

1. The method of primary printing of printed circuit wiring patterns on an insulating substrate surface in a manner increasing the number of side-by-side line conductors of suitable width, conductivity adherence and interconnector spacing on the substrate surface, comprising the steps of:
   coating an irregular surface of an insulation panel with a flat outer surface layer of liquid photopolymer,
   photographically forming on the photopolymer layer a pattern defining a wiring pattern to be printed defined by a residue layer pattern having cured flat top ridges with interspersed channels with sidewalls extending down toward the surface of the panel,
   simultaneously depositing in the channels on both of the sidewalls of said photopolymer layer and on the bottoms of said channels extending below the sidewall layers a conductive thin film layer constituting the printed wiring pattern, and
   sanding off residue conductive materials from the flat tops of the ridges to assure a predetermined insulation surface disposed between adjacent conductors and a thin film conductor of greater width than the width of the channels.

2. The method of claim 1 including the steps of forming the photopolymer layer with a thickness of about 0.006 inch, and forming the channels with a width of about 0.003 inch.

3. The method of claim 1 including the step of treating the surface of the substrate with the pattern therein with a catalytic material for enhancing electroless copper deposition and depositing said conductor as an electroless copper layer thereover.

4. The products produced by claim 1.

5. In an additive method of printing primary wiring patterns onto insulating substrates, the improvement comprising the steps of:
   establishing a desired printed wiring pattern on an insulating panel by forming a substantially flat surface over the panel by depositing thereon a layer of liquid photopolymer insulating material, defining by photographically forming and developing in said layer patterns of a plurality of conductor lines indented from said flat surface with insulation barriers of hardened photopolymer dispersed between adjacent conductor lines of the patterns, with the conductor lines patterns comprising indented channels in the hardened photopolymer layer presenting substantially perpendicular to the panel adjacent sidewalls of substantially the thickness of the patterned layer,
   forming simultaneously thin film metallic conductors in the channel bottoms, on the flat top surface, and on the opposing channel sidewalls above the metallic conductors in the bottoms thereby extending the conductor with available between adjacent conductors by substantially twice the thickness of the photopolymer layer, and, removing any conductive material on the substantially flat top surface of the patterned layer thereby to define by photographic exposure and development of the photopolymer layer an insulation gap of known dimensions between adjacent conductors and to form a primary wiring pattern of conductors indented in the photopolymer layer.

6. The products produced by claim 5.

7. The additive method of processing printed wiring boards to produce primary circuit patterns thereon, comprising the steps of:

providing a basic substrate panel with a substantially flat surface subject to irregularities from flatness of the order of at least 0.001 inch, depositing thereover a layer of liquid photopolymer of pastelike consistency having a thickness of greater than 0.002 inch, photoprinting with a flat glass plate image bearing body in contact with the liquid polymer to produce a flat surface thereon and a surface contour having said flat surface and a wiring pattern disposed in the layer of polymer on the substrate panel defined by channels indented downwardly from the flat surface into the polymer layer to have sidewalls substantially perpendicular to the substrate panel, simultaneously depositing in the bottoms of the channels and extending upwardly on the sidewalls above the deposits in the bottoms a thin film layer of metallic conductor to form the wiring patterns whereby the width of the conductors is effectively increased by the heights of the two sidewalls, and machining off any residue conductor on the top flat surface to assure a predetermined width of insulation barrier between adjacent conductors.

8. The method of claim 7 including the steps of applying a catalytic layer to the contoured surface over the flat surface and in the indented channel portions thereof, and electroless depositing conductor onto the catalytic layer before the flat surface is machined, leaving the panel surface and the polymer layer sidewalls defining the channels covered with conductor.

9. The method of claim 7 including the steps of roller coating the flat surface with an insulation material and electroplating the exposed electroless deposit in the channels only, before removing the conductor from the top flat surface.

10. The method of claim 7 including the steps of providing the photopolymer layer in a thickness greater than 0.005 inch and channel widths of about 0.002 inch thereby to achieve a polymer layer thickness to line width ratio substantially greater than one.

11. The method of claim 7 wherein the mechanical step of removing conductor from the flat surface comprises sanding the surface.

12. The method of claim 7 wherein said catalytic layer is machined from said flat surface prior to the deposition of electroless conductor, thereby limiting the build up of conductor to the indented channels.

13. The method of claim 12 including the step of confining the residue of said machining step so as to facilitate the recovery of the precious metal therein.

14. The products produced by claim 7.

* * * * *